United States Patent [19]

Yoshie et al.

[11] Patent Number: 5,150,087
[45] Date of Patent: Sep. 22, 1992

[54] ELECTRICAL SIGNAL FILTER AND METHOD FOR MANUFACTURE OF ELECTRICAL SIGNAL FILTER INTERNAL CIRCUIT BOARD

[75] Inventors: Hiroto Yoshie, Sagamihara; Hironobu Sato, Isehara, both of Japan

[73] Assignees: Mitsumi Electric Co., Ltd., Japan; Regal Technologies Ltd., Englewood, Colo.

[21] Appl. No.: 619,942

[22] Filed: Nov. 29, 1990

[30] Foreign Application Priority Data

| Nov. 30, 1989 | [JP] | Japan | 1-138713[U] |
| May 31, 1990 | [JP] | Japan | 2-57817[U] |
| Oct. 27, 1990 | [JP] | Japan | 1-126324[U] |
| Oct. 31, 1990 | [JP] | Japan | 2-114604[U] |
| Oct. 31, 1990 | [JP] | Japan | 2-114605[U] |
| Oct. 31, 1990 | [JP] | Japan | 1-114606[U] |
| Oct. 31, 1990 | [JP] | Japan | 2-114607[U] |
| Oct. 31, 1990 | [JP] | Japan | 2-294877[U] |

[51] Int. Cl.$^5$ ............................................. H03H 7/00
[52] U.S. Cl. ....................................... 333/185; 333/167; 333/12
[58] Field of Search ............... 333/185, 12, 167, 175, 333/176, 168, 177, 178, 179, 180, 181, 182, 183, 169, 170, 24 R

[56] References Cited

U.S. PATENT DOCUMENTS

| 4,451,803 | 5/1984 | Holdsworth et al. | 333/12 |
| 4,701,726 | 10/1987 | Holdsworth | 333/185 |
| 4,845,447 | 7/1989 | Holdsworth | 333/167 |

Primary Examiner—Eugene R. Laroche
Assistant Examiner—Ali Neyzari
Attorney, Agent, or Firm—Andrus, Sceales, Starke & Sawall

[57] ABSTRACT

An electrical signal filter in which circuit provided with filter circuits are inserted into a cylinder-shaped shield case, has a first cavity portion having an inner case. The side of one end of the inner case has the circuit boards inserted, and the side of the other end thereof is provided with one of an input side connector and an output side connector. The electrical signal filter also has a second cavity portion having a second shield case having an outer case. The side of one end of the second shield case is provided with one of an output side connector and an input side connector.

14 Claims, 17 Drawing Sheets

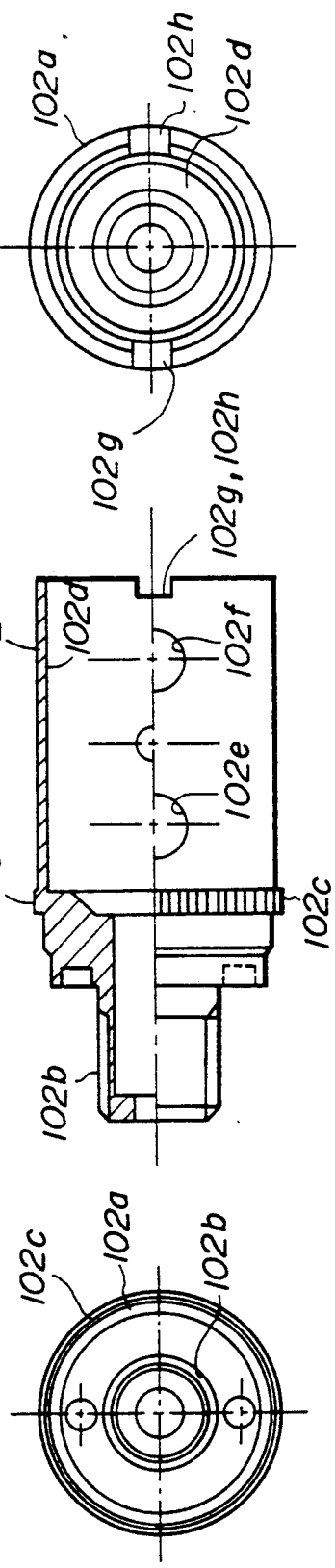

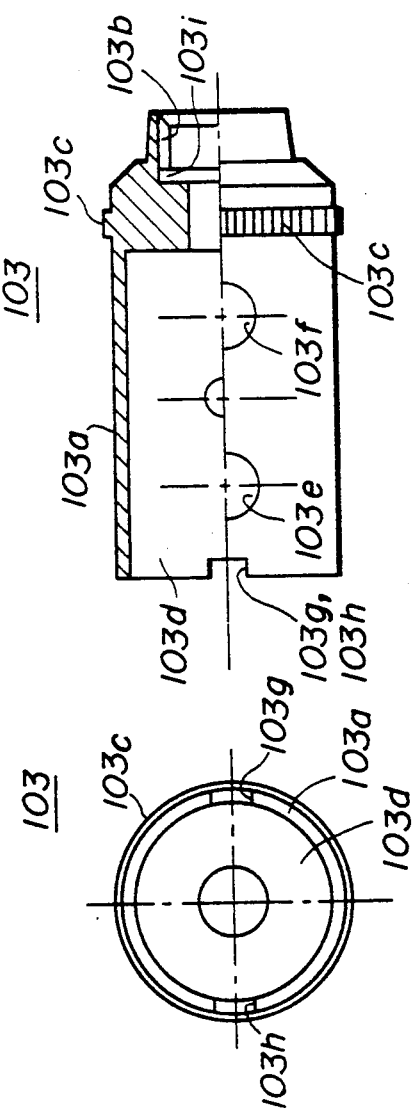

ELECTRICAL SIGNAL FILTER AND METHOD FOR MANUFACTURE OF ELECTRICAL SIGNAL FILTER INTERNAL CIRCUIT BOARD

BACKGROUND OF THE INVENTION

The present invention relates to an electrical signal filter and method for manufacture of an electrical signal filter internal circuit board, and more specifically, relates to a electrical signal filter applicable to cable television, and to a method for the manufacture of an circuit board provided internally of said signal filter.

In recent years there has been the diffusion of cable television (hereinunder termed CATV). CATV has many channels and the viewer concludes a contract with a cable television broadcasting channel and the television signals of that channel are then transmitted to his/her household. Some of these many channels are such that they can be viewed by the payment of an additional charge. Normally, channels for which an additional charge is to be paid are provided with electrical signal filters (trap filters) in the cable of the CATV, so that the signals having a particular frequency are cut. The system is configured so that the channel for which said additional payment has been made is supplied to the household after this electrical signal filter has been removed.

A conventional electrical signal filter of this type is disclosed in U.S. Pat. No. 4,451,803.

This electrical signal filter comprises a single circuit board having a filter circuit, a housing (shield case) housing this filter circuit and a shield portion that magnetically insulates this circuit board inside the housing.

This circuit board is divided into two portions, each of which are provided with different filter circuits. In addition, each of the filter circuits is electrically connected to the circuit board. Furthermore, at one of the ends of this circuit board is disposed a connector for output, and to the other of the ends is provided an input terminal.

The housing comprises the three portions of a filter housing portion, a filter cap, and a connector for a cylindrical housing. The filter housing portion has the circuit board inserted into it and encased with a filter cap, with the outer periphery being covered by the cylindrical housing. When the circuit board is inserted into this filter housing, the connectors provided to the circuit board are brought into engagement with the connector housing portion that has been formed beforehand on the filter housing portion.

In addition, there are two shield members provided and the two filter circuits inside the housing are magnetically shielded. These magnetic shield members are configured so that they are directly fixed to each of the circuit boards.

However, in such a conventional electrical signal filter, there are many parts comprising the housing and so there is the problem of the efficiency of assembly being poor.

In the aforementioned electrical signal filter, the cylindrical housing is provided so that it surrounds the outer periphery of the filter housing portion. Thus, it is necessary to provide shielding portions at both ends of the filter housing portions and the cylindrical housing. The signals are liable to leak at the shielding portions. In addition, the shielding portions do not have strong mechanical strength, as compared with other portions. For the above reason, it is desirable to reduce the number of shielding portions as small as possible.

Conventionally, rubber O-rings are provided at the shielding poritions, so that the shielding portions are protected from rain, dust and the like. However, the rubber O-rings deteriorate with age, which are prone to incorrect installation and damage during installation, and may accidentally be left out of the final assembled unit in the manufacturing process (and this cannot be verified since the O-rings are internal to the unit and not visible in the final product).

Not only this, as has been described earlier, when the housing is assembled, the connectors provided to the circuit board are brought into engagement with the connector housing portion that has been formed beforehand on the filter housing portion and these connectors have a cylindrical shape and are not provided with a mechanism whereby they can be fixed to the circuit board. Because of this, when the connectors are soldered to the circuit board, it is difficult to position the connectors at the required position, and this causes the problem of making the soldering work more difficult. Furthermore, if the positioning to the circuit board is not performed accurately, then there is the additional problem that the connectors will not be able to engage properly with the connector housing portion.

Furthermore, each of the shield members comprises a signal circular-shaped plate and is provided independently and separately above the circuit board and so it is difficult to solder each of the shield members and the filter housing portion when one has been encased, thereby to consequently cause the problem of there not being sufficient shielding performance.

In addition, a circuit board is provided to the inside of the electrical signal filter as has been described above but there are also the following problems when this circuit board is manufactured. The following is a description of the method of manufacture of a conventional circuit board of this type and the problems associated with the manufacture of a conventional circuit board of this type.

In general, circuit boards that have an electrical signal filter incorporated into them have a relatively small shape and because of this, many of them are manufactured from a large mother board of the required shape. One of the methods of manufacturing a plural number of circuit boards from this mother board is known as the pushback method.

This pushback method involves punching circuit boards of required shape by general press processing to the mother board prior to providing the electronic elements to the circuit board, and then returning these punched circuit boards to the mother board.

The following is a description of the method of manufacture of a circuit board by the conventional pushback method, with reference to FIG. 1 through FIG. 4.

FIG. 1 shows a mother board 1. Press punch processing is first performed with respect to this mother board 1 and circuit boards 2 of the predetermined and required shape are punched out. When this press punch processing is performed, the opening of insertion holes and the like for the electronic elements are also implemented at the same time.

Following this, the circuit boards 2 that have been punched out are again returned to the mother board 1. FIG. 2 shows the status where the circuit boards 2 that have been punched out are again returned to the mother board 1. The reason for returning the circuit boards 2 that have been punched out, back to the mother board 1 is that in the process for the provision of the electronic elements and the like and which is performed as the following process, it is easier if this work is performed with respect to the large mother board 1 rather than with respect to the small circuit boards 2 and this, coupled with the fact that it is possible to perform batch processing with respect to many circuit boards 2 enables the productivity to be increased.

As has been described above, when the circuit boards 2 are returned to the mother board 1, stress release holes 3 are punched as shown in FIG. 3. When the circuit boards 2 are punched from the mother board 1, burrs are created at the positions of the cuts and when the circuit boards 2 are returned to the mother board 1, these burrs enter between the circuit boards 2 and the mother board 1 to create stresses in the circuit boards 2 and warping may occur in the circuit boards 2 when these stresses are large. This stress and the occurrence of warping adversely affects the soldering and the following process for the provision of electronic elements and contributes to the lowering of the reliability of the product. Accordingly, the forming of the stress release holes 3 prevents the generation of this stress and the consequent warping.

When the stress release holes 3 are formed, the required processing for the provision of the electronic elements is implemented with respect to each of the circuit boards 2 that are monolithic with the mother board 1. FIG. 4 shows the status where this required processing has been completed.

Following this, when the processes described above have been completed, each of the circuit boards 2 is taken from the mother board 1 and when each of the circuit boards 2 is taken from the mother board, the conventional method has been to press the circuit boards 2 to remove them from the mother board 1.

In the method described above for the manufacture of a circuit board by the pushback method, it is desirable that the circuit boards 2 be firmly held to the mother board 1 when the electronic elements and the like are being provided. If this holding force is small, then there is the fear that the circuit boards 2 will become separated from the mother board 1 in the processes for the provision of the electronic elements and the like, as has been described above, to therefore create an undesirable situation for processing.

On the other hand, when the circuit boards 2 are firmly held onto the mother board 1, it becomes more difficult to take the circuit boards 2 off of the mother board 1 and the task of taking them off becomes more difficult. Because of this, when the stress release holes 3 are formed as described above, board removal holes are also formed so that the task of removing the circuit boards 2 from the mother board 1 is facilitated. However, when these board removal holes are also formed along with the stress release holes 3, the strength by which the mother board 1 holds the circuit boards 2 is reduced and there is the fear that the circuit boards 2 will fall off of the mother board 1 during the process for the provision of the electronic elements and the like.

In such a conventional manufacturing method, it is necessary to have a strong holding force in the provision of the electronic elements and the like and it is also desirable that there be a weak holding force when the circuit boards 2 are removed. There are therefore these mutually contradictory requirements and there is the problem that it is not possible to satisfy both of them at once.

SUMMARY OF THE INVENTION

With respect to these problems, the present invention has as an object the provision of an electrical signal filter and method for manufacture of an electrical signal filter internal circuit board which is novel and in which the problems described above are eliminated.

Another object of the present invention is to provide an electrical signal filter in which circuit boards which are provided with filter circuits, are inserted into a cylinder-shaped shield case provided with a first cavity portion having an inner case, the side of one end of which has the circuit boards inserted, and the side of the other end of which is provided with one of an input side connector and an output side connector, and a second cavity portion having a second shield case having an outer case, the side of one end of which is provided with one of an output side connector and an input side connector.

An electrical signal filter having the configuration described above can have the shield case configured by only the assembly of the inside and the outside cases. Because of this, it is possible to reduce the number of parts and to simplify the assembly work.

Another object of the present invention is to provide an electrical signal filter comprising: an inner case having, at a first end thereof, a first hollow portion into which a circuit board is inserted and having, at a second end thereof, a first connector; an outer case having, at a first end thereof, a second hollow portion into which the inner case is inserted, and having, at a second end thereof, a second connector which engages with the first connector, the inner case and the outer case forming a shield case, wherein one of the first and second ends of the outer case is rolled over the the inner case at a point of sealing.

Another object of the present invention is to provide an electrical signal filter comprising:

an inner case having, at a first end thereof, a first hollow portion into which a circuit board is inserted and having, at a second end thereof, a first connector; an outer case having, at a first end thereof, a second hollow portion into which the inner case is inserted, and having, at a second end thereof, a second connector which engages with the first connector, the inner case and the outer case forming a shield case, wherein the inner case and the outer case are sealed using an ultraviolet light hardening adhesive at a point of sealing.

Another object of the present invention is to provide an electrical signal filter provided with a cylinder shaped holder portion, a contact provided inside this holder portion, and a contact terminal that connects with this contact, and a connector which is fixed to this circuit board by soldering the contact terminal to the circuit board, so that the holder portion is provided with a support portion to engage with the circuit board and support it.

In an electrical signal filter having the configuration described above, it is possible to hold the circuit board by the support portion fixed on the holder portion. Because of this, it is possible to perform soldering in the state where the connector is positioned on the circuit board and therefore improve the workability of the soldering work, and at the same time improve the accuracy of positioning the connector with respect to the circuit board.

Still another object of the present invention is to provide an electrical signal filter having a configuration a wherein a shield member is disposed between a first filter circuit and a second filter circuit formed on the circuit board, and in which the circuit board and shield portion are inside a cylinder-shaped shield case, and wherein the shield portion is assembled from the two half shield portions.

By adopting the configuration described above, the first filter circuit and the second filter circuit are shielded by the two halves of the shield portion. Accordingly, it is possible for the first filter circuit and the second filter circuit to be magnetically shielded more effectively.

Yet another purpose of the present invention is to provide an electrical signal filter having a configuration wherein a shield member is provided between the first filter circuit and the second filter circuit, and wherein this circuit board and shield member are fitted inside a cylinder-shaped case, and the shield member and the shield case are soldered, and wherein a portion opposing the shield case of the shield member is formed into a taper shape and this taper portion is filled with solder to solder the shield member and the shield case.

In an electrical signal filter having the configuration described above, when the shield member is soldered to the shield case, the melted solder flows into the taper portion. Accordingly, the solder does not run into the central portion of the shield member and it is possible to have definite soldering of the shield member to the shield case. In addition, by forming the taper portion, the contact surface area of the solder is increased and this also enables more definite soldering of the shield member to the shield case.

Still another object of the present invention is to provide an electrical signal filter having a configuration in which a shield member is provided between a first filter circuit and a second filter circuit, and in which the circuit board and shield member are fitted inside a cylinder-shaped shield case, and wherein the shield member is configured from a pair of shield member halves, and wherein there is provided a mechanism to clamp this pair of shield member halves in the status where they are assembled.

In an electrical signal filter having the configuration described above, it is possible to assemble the pair of shield member halves by clamping the pair of shield member halves. Accordingly, it is possible to handle the shield member comprising the two members, as if it were one member.

Another object of the present invention is to provide an electrical signal filter with a configuration comprising a first circuit board provided with a first filter circuit, a second circuit board provided with a second filter circuit, and a shield member disposed between the first circuit board and the second filter circuit, so that they can be inserted in a line into a cylinder-shaped shield case, and wherein a conductor electrically connecting the first circuit board and the second circuit board is a portion that is opposed to the first circuit board on the second circuit board at a predetermined position of a part opposing the second circuit board on the first first circuit board, and disposed between a position separated from a predetermined position on the first circuit board.

By the configuration described above it is possible to provide a conductor in a state whereby it is disposed at an angle between the first circuit board and the second circuit board. Accordingly, it is possible for the force that is applied in the direction so as to separate each of the circuit boards to be absorbed since the length of the conductor is relatively long, and therefore prevent the breaking of the conductor. In addition, when there is fitting to the shield case, there is no free play of the conductor inside the shield case since the conductor spans diagonally between the first circuit board and the second circuit board.

Another object of the present invention is to provide a method for the manufacture of a circuit board, wherein circuit boards are punched to a predetermined shape from a mother board, and the punched circuit boards are then returned to the mother board, required processing is performed with respect to these circuit boards and when the required processing is completed, removal holes that laterally or longitudinally cross the mother board are formed so that circuit boards remain at positions where the circuit boards are to be cut out either laterally or longitudinally, and the circuit boards are then taken from the mother board at positions where these removal holes have been formed By the use of the method of manufacturing the circuit boards, there is no formation in the mother board of the holes for the removal of the circuit boards when the required processing is performed with respect to the mother board to which the punched circuit boards have been returned, and the circuit boards are firmly supported on the mother board so that it is not necessary to consider the falling off of the circuit boards when the above processing is performed. In addition, the taking off of the circuit boards from the mother board is performed by leaving the circuit boards in place and forming removal holes in the mother board so that they cross the mother board either longitudinally or laterally.

Another object of the present invention is to provide an electrical signal filter that is provided with a first filter circuit and a second filter circuit on the same circuit board, and that is provided with a portion for the attachment and removal of a shield member between the first filter circuit and the second filter circuit of the circuit board, a portion that surrounds the first filter circuit and a first case comprising an input side connector of this first filter circuit, a portion that surrounds the second filter circuit and a second case comprising an output side connector of this second filter circuit, so as to cover the circuit board.

By the adoption of the configuration described above, it is possible to provide a first and a second filter circuit on the same circuit board and reduce the number of parts while at the same time simplifying the configuration by having the case and the connectors in the same unit, thereby facilitating the assembly process.

Other objects and characteristics of the present invention will be understood by the detailed description of the embodiments, with reference to the appended drawings.

BRIEF DESCRIPTION OF THE DRAWINGS

FIG. 29A through FIG. 29C show the input side case; and

FIG. 30A through FIG. 30C show the output side case.

DESCRIPTION OF THE PREFERRED EMBODIMENTS

Figure 1:
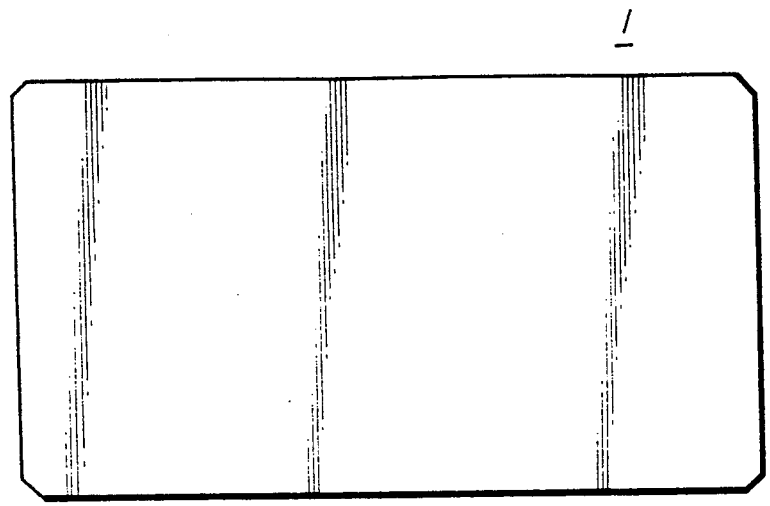
FIG. 1 through FIG. 4 are figures for describing the method of manufacture of a conventional circuit board.
Figure 2:
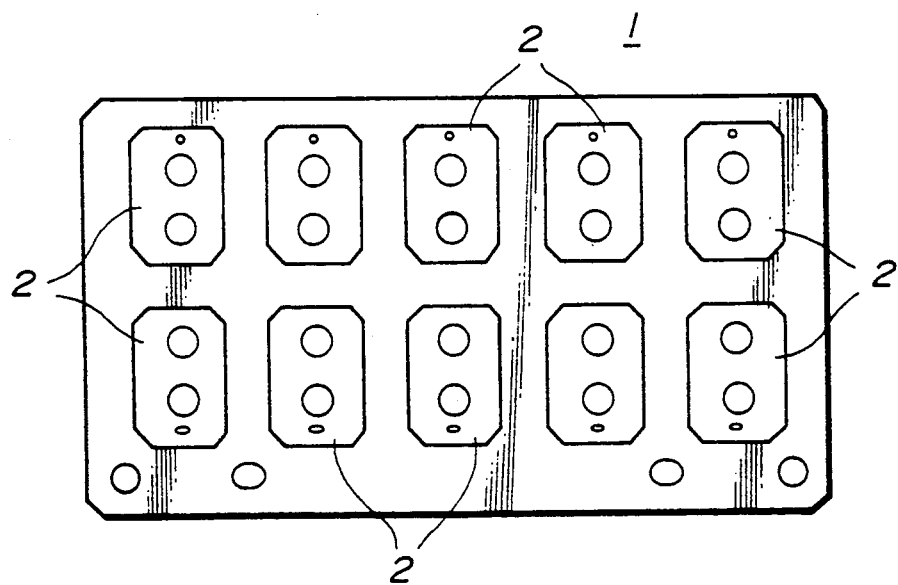
Figure 3:
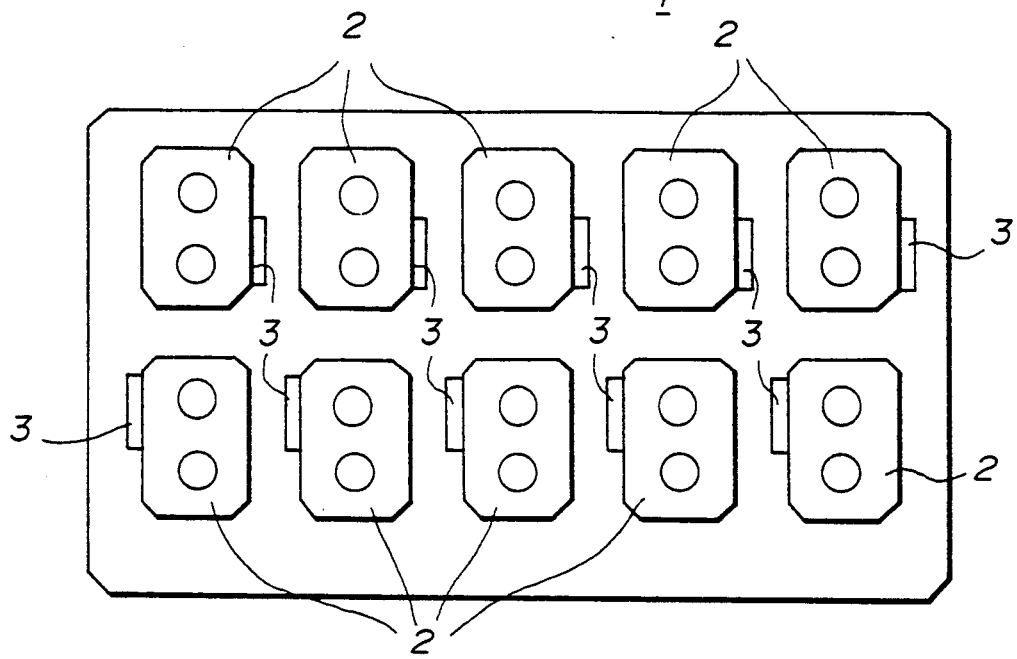
Figure 4:
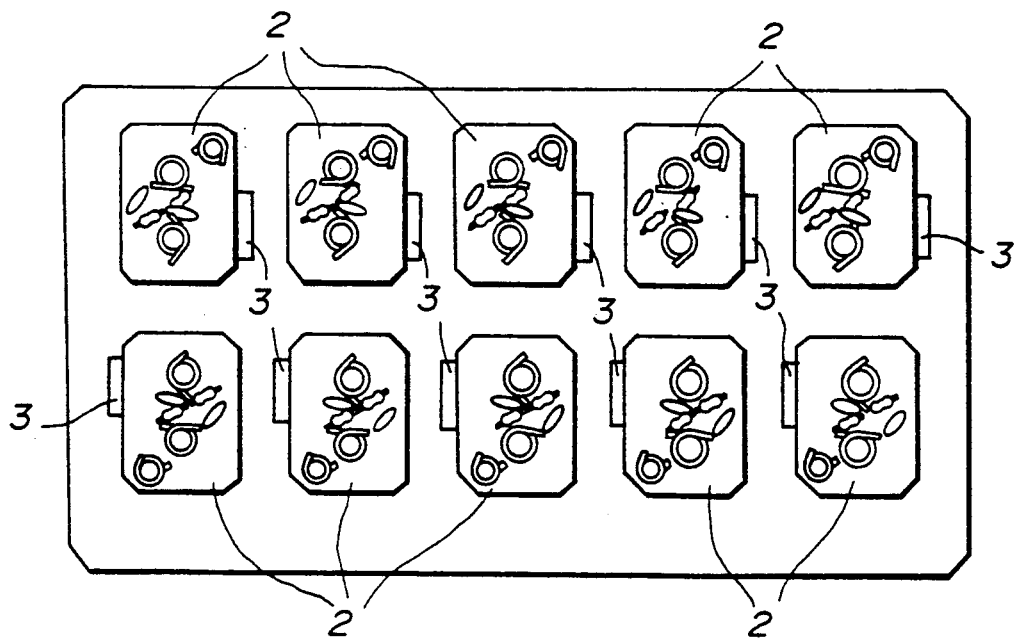
Figure 5:
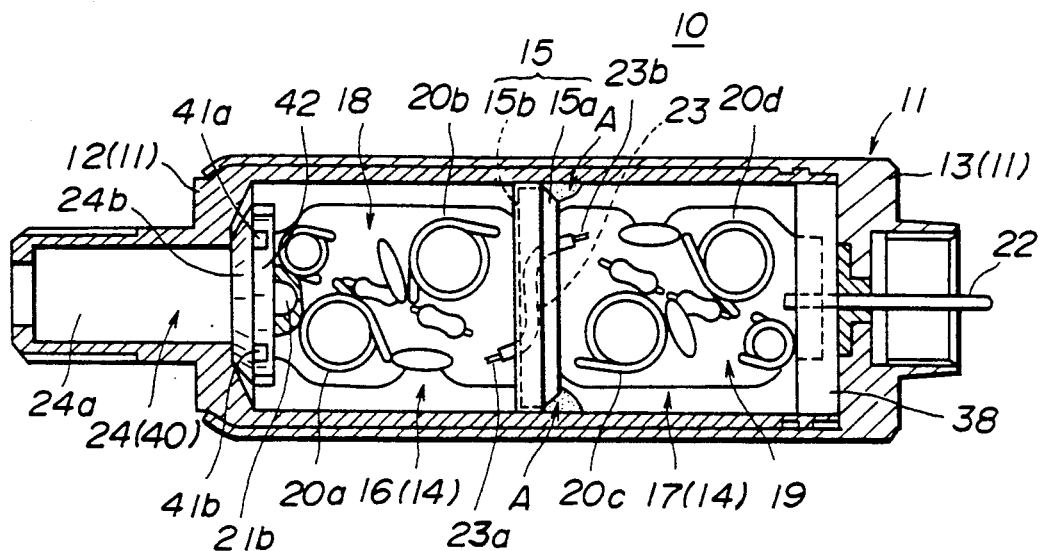
FIG. 5 and FIG. 6 are sectional drawings of an electrical signal filter of the first embodiment according to the present invention.
Figure 6:
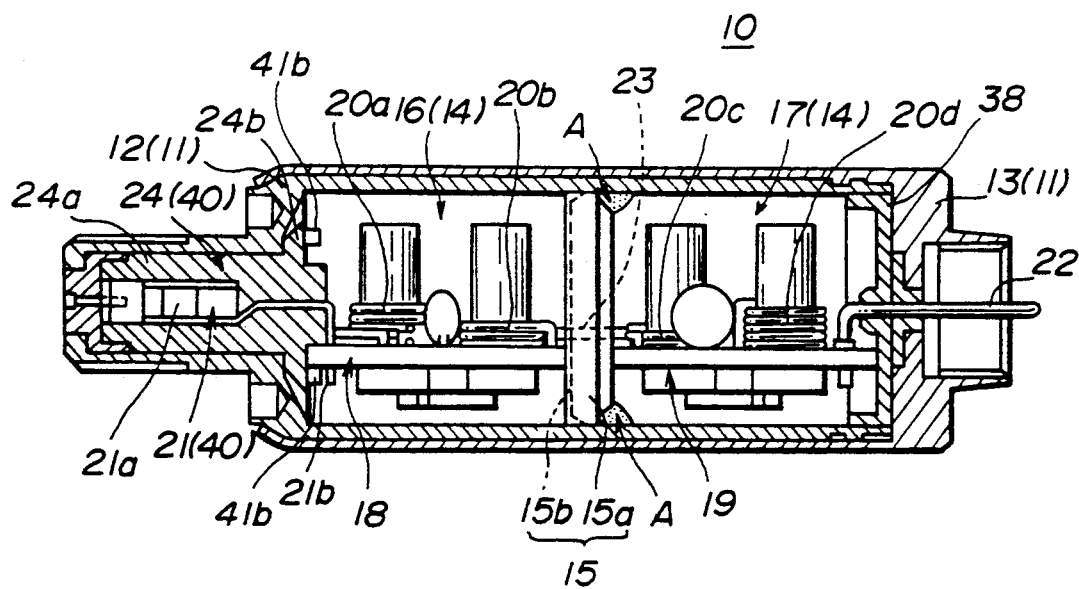
Figure 7A:
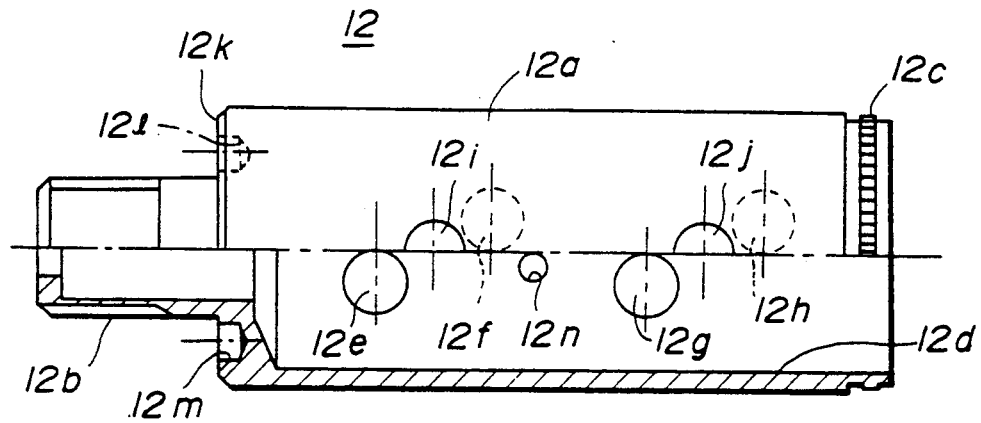
FIG. 7A through FIG. 7C are drawings describing an inner case.
Figure 7B:
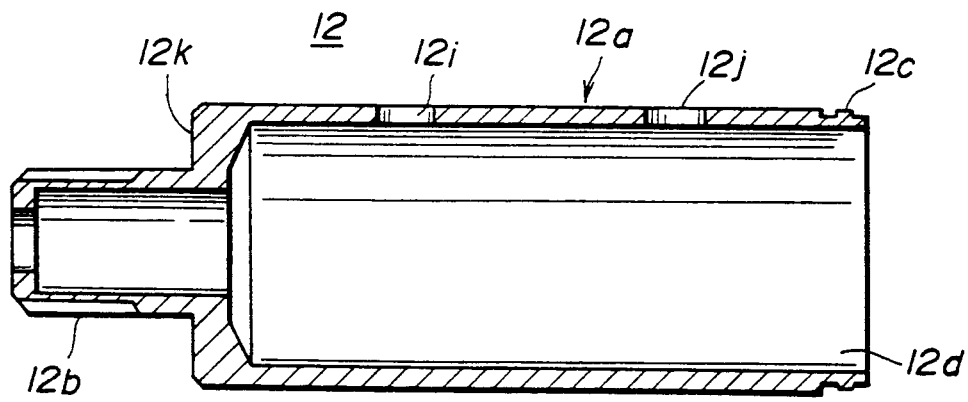
Figure 7C:
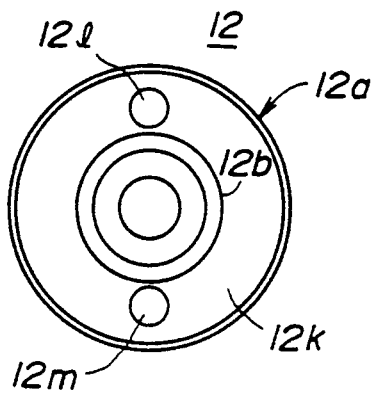

The following is a description of the first embodiment of the present invention, with reference to FIG. 5 and FIG. 6.

An electrical signal filter 10 has a configuration comprising a large shield case 11 formed by a cylindrical shaped input side case (inner case 12) inserted into an output side case (outer case) 13, with a filter circuit 14 and a shield portion 15 being housed inside said inner case 12.

The following is a description of the structure of the shield case 11, with reference to FIG. 7A through FIG. 7C and FIG. 8A through FIG. 8C. case 12 is provided with a threaded portion 12b comprising one portion of an input side connector at one end of the cylinder-shaped inner case main body 12a, and to the periphery of the other end is provided a rollette processed portion 12c having a diameter smaller than that of the inner case main body 12a. In addition, a cavity portion 12d provided on the inside of the inner case main body 12a and on the threaded portion 12b houses circuit boards 18,19 and a resin holder 24 to be described in more detail later. In addition, the peripheral wall of the inner case main body 12a is provided with holes 12e through 12h which are used for inductance adjustment (to be described later) and dispenser insertion holes 12n which are used when soldering the shield portion 15. Furthermore, at a position opposing the holes 12e through 12h of the inside case main body 12a described above are provided a pair of holes 12i,12j.

Furthermore, the thread portion 12b of the inner case 12 is provided with a pair of small holes 12l,12m in the wall 12k from which the threaded portion 12b of the inner case 12 protrudes. These small holes 12l,12m engage with the protruding portion of a special tool (not indicated in the figure) used to connect the thread portion 12b to another electrical signal filter, and are used to connect an electrical signal filter in series with another electrical signal filter.

Figure 8A:
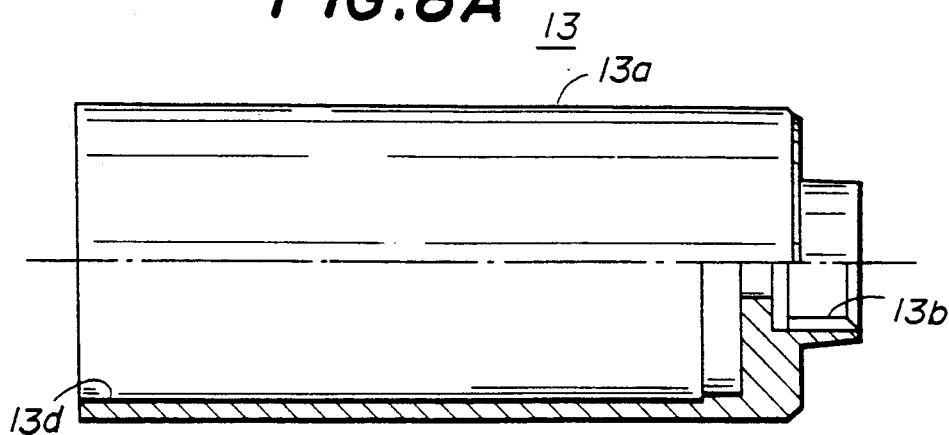
FIG. 8A through FIG. 8C are drawings describing an outer case.
Figure 8B:
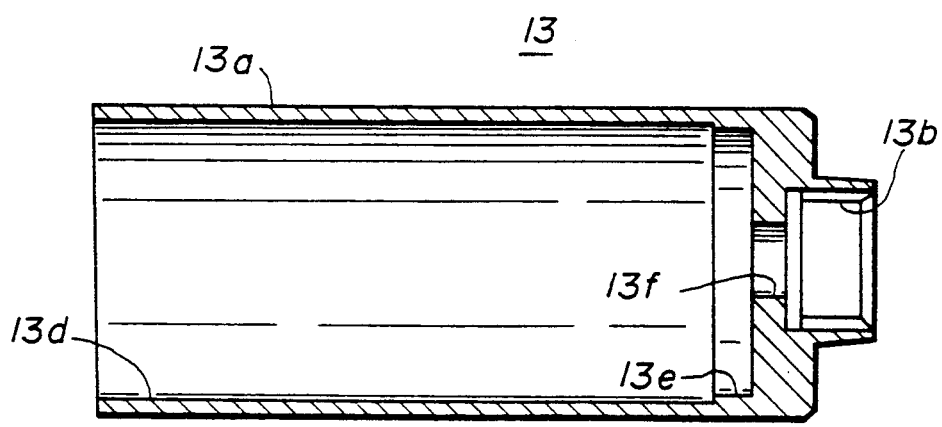
Figure 8C:
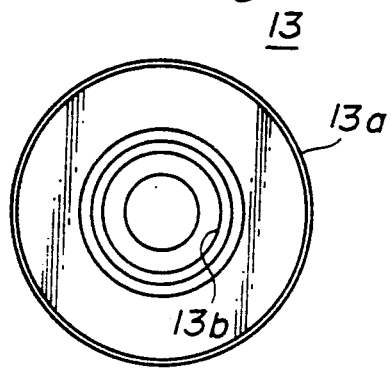

As indicated in FIG. 8A through FIG. 8C, the outer case 13 comprises a cylinder-shaped outer case main body 13a into which the inner case 12 described above is inserted, and a threaded portion 13b that configures one portion of an output side connector provided to one end of the outer side case main body 13a. To the inside wall of the outer side case main body 13a is formed a cavity portion 13d and a female threaded portion 13b passes through this cavity portion 13d.

To the outer periphery of the outer side case main body 13a are not formed holes such as those of the inner case 12. In addition, the dimension of the diameter of the inner periphery of the outer side case main body 13a is set to be slightly larger than the dimension of the outer diameter of the inner case 12 so that the inner case 12 can be housed inside the cavity portion 13d. Also, the depth of the cavity portion 13d has a length so that the inner case main body 12a can be housed. Furthermore, the depth of the cavity portion 13d is provided with a step portion 13e, and the inner diameter of this step portion 13e has a diameter which is slightly smaller than the rollette processed portion 12c of the inner case 12.

Returning to FIG. 5 and FIG. 6, the description will continue for the internal structure of the electrical signal filter 10.

The filter circuit 14 comprises a first filter circuit 16 and a second filter circuit 17, and the first filter circuit 16 is disposed to a first circuit board and the second filter circuit 17 is disposed to a second circuit board 19. The first filter circuit 16 and the second filter circuit 17 are LC circuits comprising coils 20a through 20d and condensers and the like, and are connected to a print pattern (not indicated in the figure) formed on each of the circuit boards 18,19. Moreover, the coils 20a through 20d are configured so as to adjust the inductance.

Numeral 21 is an input side contact, and this input side contact 21 is disposed inside the resin holder 24 mounted to the first circuit board 18. This resin holder 24 and the input side contact 21 configure an input side connector 40. In addition, numeral 22 is an output side contact pin, one end of which is soldered to the second circuit board 19, and the other end of which is bent and extends to the output side.

Figure 9:
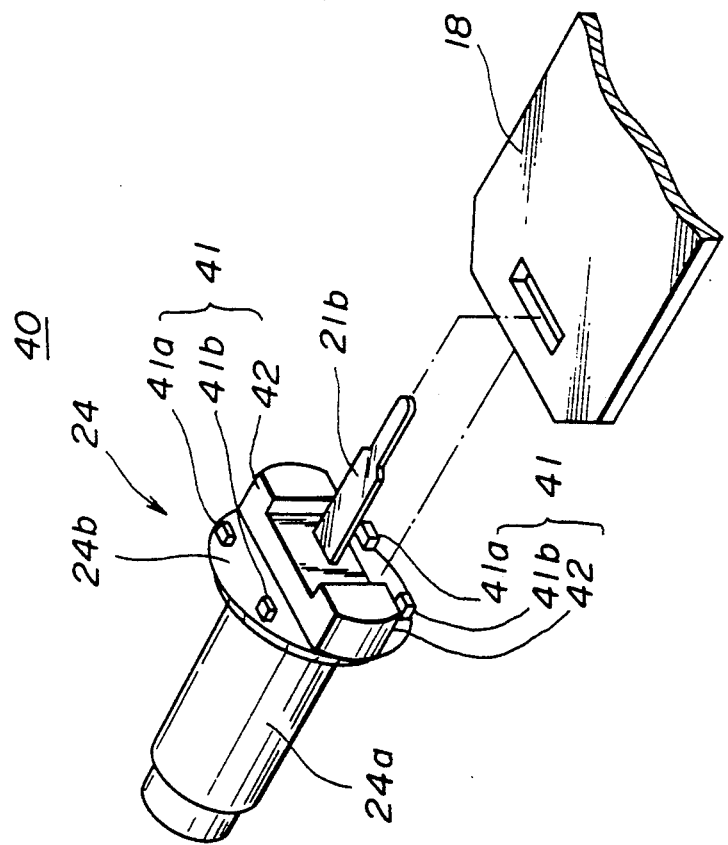
FIG. 9 is a drawing describing an input side connector.

The following will be a description of the structure of the input side connector 40, with reference to FIG. 5, FIG. 6 and FIG. 9.

The resin holder 24 is configured from a cylinder shaped portion 24a and a rim portion 24b. The input side contact 21 is inserted to and fitted to this cylinder shaped portion 24a.

The input side contact 21 is press formed from conductive metal plate, and the rear end of it (the direction to the right, in the drawing) is monolithically formed with a connector 21b. In addition, to the forward end of the input side contact 21 are formed a pair of plate spring portions to configure a contact portion 21a.

When the electrical signal filter 10 is connected to another electrical signal filter, an output side contact pin provided on the other electrical signal filter is inserted into this contact portion 21a. When the output side contact pin is inserted, the output side contact pin is held by the spring force into a contact portion 21a having a pair of plate spring portions. By this, it is possible for the input side contact 21 and the output side contact pin to the definitely connected. Moreover, the connector 21b extends to the rear of the resin holder 24 in the state where the input side contact 21 is mounted to the resin holder 24.

The rim portion 24b forms a monolithic support mechanism 41 and so it is not difficult to form.

In this support mechanism 41, the dimension of the gap between each of the support protrusions 41a,41b and the support step portion 42 is a dimension which is the same as or slightly smaller than the dimension of the thickness of the first circuit board 18. Accordingly, by inserting the first circuit board 18 in between each of the support protrusions 41a,41b and the support step portion 42, the first circuit board 18 is supported by the support mechanism 41. By this, it is possible to stop the first circuit board 18 into the resin holder 24 prior to soldering to the first circuit board 18.

Accordingly, it is possible to solder the connector 21b to the first circuit board 18 in the state where the first circuit board 18 and the resin holder 24 are positioned and it is possible to therefore improve the workability of the soldering work. In addition, the first circuit board 18 and the resin holder 24 are disposed inside the shield case 11 in the state where their position is determined with high accuracy and so it is possible for the center of the input side connector 40 to be in precise agreement with the center of the electrical signal filter 10. Because of this, the insertion and removal of the output side contact pin can be definitely performed. In addition, the force that is applied to the resin holder 24 when the output side contact pin is inserted and removed is received by the engaging portion of the resin holder 24 and the first circuit board 18 and since there is no force directly applied to the portion where the connector 21b is soldered, it is possible to prevent the release of the solder. Furthermore, the, work of inserting the resin holder 24 into the threaded portion 12b is facilitated.

The following is a description of the shield portion 15.

Figure 10:
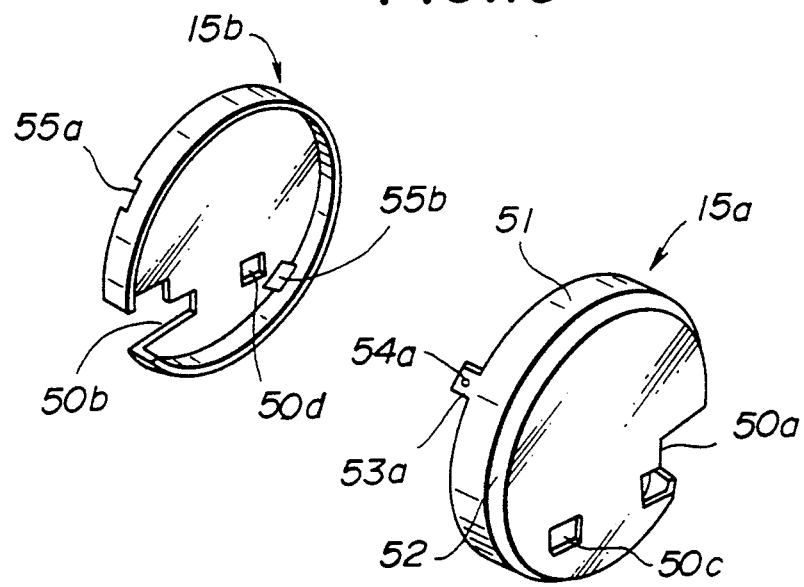
FIG. 10 is an exploded perspective view showing a shield portion.
Figure 11A:
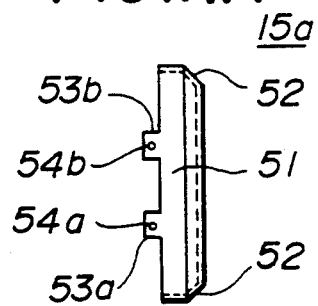
FIG. 11A and FIG. 11B are drawings describing a first shield member half.
Figure 11B:
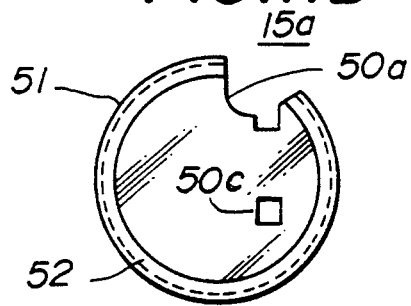
Figure 12A:
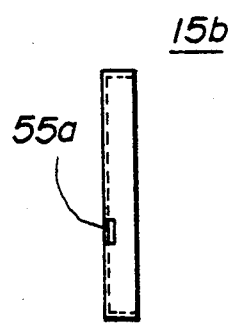
FIG. 12A and FIG. 12B are drawings for describing second shield member half.
Figure 12B:
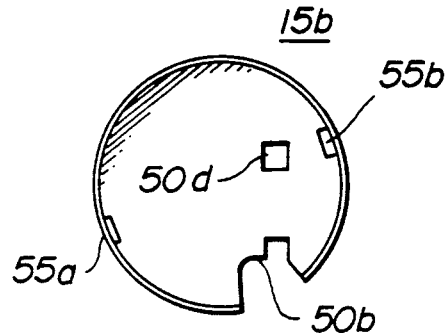

The shield portion 15 is press processed from conductive metal plate, and comprises a first shield half member 15a and a second shield half member 15b. FIG. 10 is an enlarged view of the shield member 15, and FIG. 11A and FIG. 11B are enlarged views of the first shield half member 15a, while FIG. 12A and FIG. 12B are enlarged views of the second shield member 15b.

The first shield half member 15a and the second shield member 15b both have a plate shape, and both have formed in them the cutout portions 50a, 50b, and holes 50c and 50d. These cutout portions 50a, 50b, and holes 50c and 50d are formed in order to fix the positioning of the first circuit board 18 and the second circuit board 19 in each of the first shield half member 15a and shield portion 15 when the first circuit board 18 and the second circuit board 19 are mounted to the first shield half member 15a and the second shield member 15b.

In addition, the first shield half member 15a has formed a taper portion 52 at a position (to the side other than the side to which the second shield member 15b is mounted) to the front in FIG. 10, of the outer peripheral portion 51 of the first shield half member 15a. Also, to a required position opposing the second shield member 15b of the outer peripheral portion 51 are formed a pair of stoppers 53a,53b. These stoppers 53a,53b have formed small protrusion 54a,54b so as to protrude in the inwards direction.

On the other hand, the second shield member 15b has the dimension of its diameter selected so as to engage with the inside of the first shield half member 15a, and at a position opposing the stoppers 53a,53b described above are formed stopper holes 55a,55b. These stopper holes 55a,55b and the stoppers 53a,53b together configure a stopper mechanism that fixes the pair of first shield half member 15a and second shield member 15b.

The first shield half member 15a and the second shield member 15b that have the configuration described above, are positioned and assembled so as to oppose each other in the state shown in FIG. 10. In the status where the first shield half member 15a and the second shield member 15b are assembled, the stoppers 53a,53b are inserted into the stopper holes 55a,55b, and the small protrusions 54a,54b formed on each of the stoppers 53a,53b are made to engage with the rim portions of the stopper holes 55a,55b so that the first shield half member 15a and the second shield member 15b are fixed in place.

After the positioning has been completed, the first shield half member 15a and the second shield member 15b can be handled as the one member and so the processing after that is facilitated. In addition, the work for fixing can be easily performed by simply pressing from the two sides of each of the first shield half member 15a and the second shield member 15b once the stopper holes 53a,53b and the stopper holes 55a,55b have been positioned. In addition, the stopper mechanism can be formed monolithically when the first shield half member 15a and the second shield member 15b are formed. Because of this, the work for the assembly is not complicated since stopping is performed.

Still furthermore, as has been described above, the shield portion 15 has a structure whereby the first shield half member 15a and the second shield member 15b are combined and so the shields of the second filter circuit 17 and the first filter circuit 16 are the same as if they were of two shield plates. Because of this, it is possible to definitely shield the first filter circuit 16 and the second filter circuit 17 and to prevent interference between the first filter circuit 16 and the second filter circuit 17.

The following description refers to FIG. 5 and FIG. 6.

The electrical connection between th first circuit board 18 and the second circuit board 19 is performed by the conductor 23. In this manner, the circuit board is divided into two and made of the first circuit board 18 and the second circuit board 19, with a configuration where the first circuit board 18 and the second circuit board 19 are connected by the conductor to thereby improve the magnetic separation efficiency of the first circuit board 18 and the second circuit board 19.

One of the end portions 23a of the conductor 23 is connected by soldering to a position on one side of a portion of the first circuit board 18 opposing the second circuit board 19. Furthermore, the other conduction portion 23b of the conductor 23 is connected by soldering a portion of the second circuit board 19 to a portion of the second circuit board 19 opposing the first circuit board 18 but that position is selected as a position separated from a position where the first circuit board 18 is connected by the conductor 23.

More specifically, the end portion 23a of the conductor 23 is connected to a position downwards in FIG. 5, and the other end portion 23b is separated from this position and connected to position upwards. By having this configuration, the length of the conductor 3 becomes relative longer than that of the conventional configuration where the lines are joined at opposing positions. In addition, the conductor 23 has a configuration where the gap portion between the first circuit board 18 and the second circuit board 19 is spanned by a diagonal line.

The previously described shield portion 15 is formed with cutout portions 50a,50b (refer to FIG. 10) when the first shield half member 15a and the second shield member 15b are engaged, inserting the conductor 23 to into them causes the conductor 23 to pass through the shield portion 15.

As has been described above, the first circuit board 18, the second circuit board 19 and the shield portion 15 and the like are inserted into and fixed to the shield case 11 in a line and therefore configure the electrical signal filter 10.

The following is a description of the method of manufacture of the first circuit board 18 and the second circuit board 19.

Figure 13:
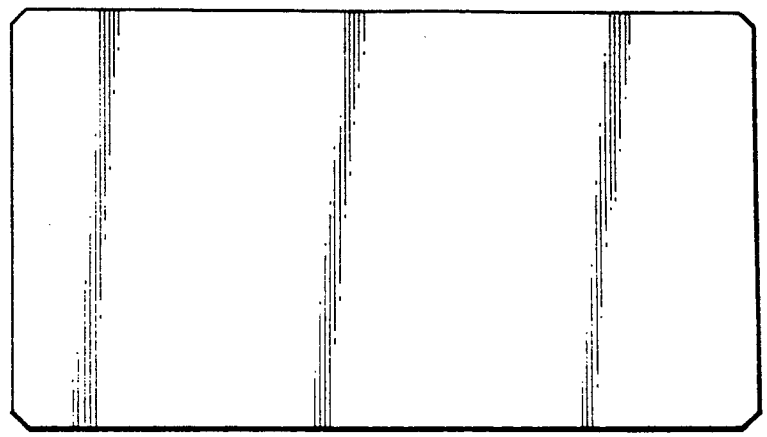
FIG. 13 through FIG. 17 and FIG. 18A-18B, 19A-19B, 20, 21A-21C, 22 and FIG. 23 are diagrams for describing the order of manufacturing processes in the method of manufacture of a circuit board having an internal electrical signal filter of one embodiment according to the present invention.

FIG. 13 shows a mother board 25. First, press punch processing is implemented with respect to this mother board 25, and the first circuit board 18 and second circuit board 19 of the required shape are pressed out. When this press processing is performed, the holes for the insertion of the electronic elements such as resistors and the like (not indicated in the figure), the engagement hole 26 to engage the coil bobbin of the coils 20a through 20d, the connection hole 27 to connect the input side contact 21, the connection hole 28 to connect the output side contact pin 22, and the holes 29 for positioning the mother board 25 are also formed.

In the present embodiment, five pairs of the first circuit board 18 and the second circuit board 19 are made from the one mother board 25. In addition, for the sake of convenience, the numerals on the parts mounted to the first circuit board 18 and the second circuit board 19 are only appended to the first circuit board 18 and the second circuit board 19 which are at the rightmost position in the drawing. However, the other four pairs of circuit boards have the same configuration as the first circuit board 18 and the second circuit board 19 which have the numerals appended.

Figure 14:
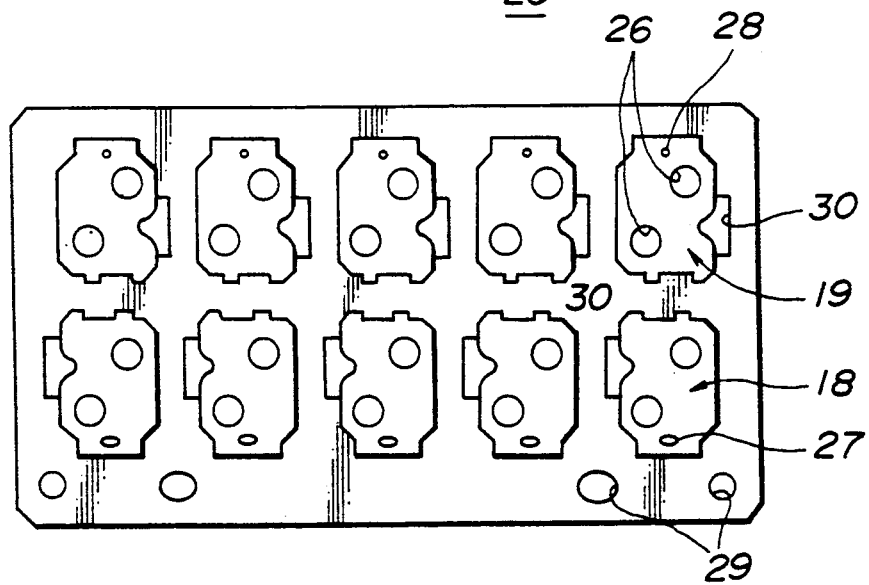

After the first circuit board 18 and the second circuit board 19 are returned to the mother board 25 (pushback), stress release holes 30 are punched into the portion of the border of the mother board 25 with the first circuit board 18 and the second circuit board 19. FIG. 14 shows the status where there has been the pushback of the first circuit board 18 and the second circuit board 19 to the mother board 25 and where the stress release holes 30 have been provided. By the formation of these stress release holes 30, it is possible to prevent the generation of stress and warping in the first circuit board 18 and the second circuit board 19 once they have been pushed back to the mother board 25, and the improvement in the reliability of the product is as has been described before.

In addition, after each of the first circuit board 18 and the second circuit board 19 have been pushed back to the mother board 25, the portions that are formed on the boundary portion between the mother board 25 and the first circuit board 18 and the second circuit board 19 are the stress release holes 30 only and so the mother board 25 holds the first circuit board 18 and the second circuit board 19 by a strong holding force.

When the stress release holes 30 are formed, the required processing for the disposing of the electronic elements with respect to the first circuit board 18 and the second circuit board 19 that are a single unit with the mother board 25 is performed. More specifically, the terminals of the coils 20a through 20d, the condenser 32, the capacitor 33 and other electronic elements are inserted into the insertion holes, and the end portions of the conductor 23 that connects the first circuit board 18 and the second circuit board 19 is inserted into the insertion hole.

Figure 15:
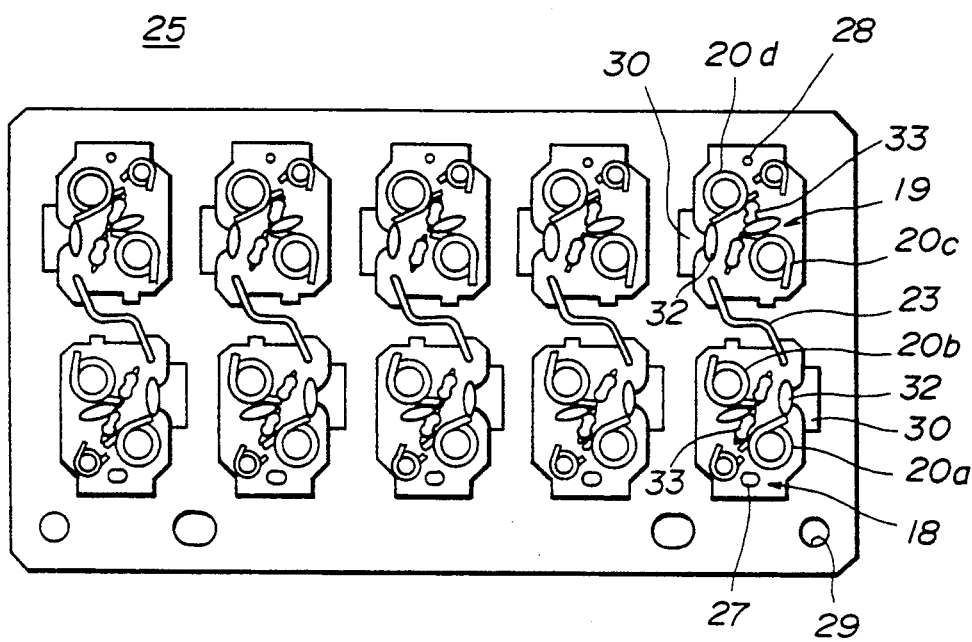

As has been described above, when the conductor 23 and the terminals of each of the electronic elements are fitted with respect to the first circuit board 18 and the second circuit board 19, the terminals of the other electronic elements and the conductor 23 are soldered to a lead pattern that has been formed beforehand on the first circuit board 18 and the second circuit board 19. Then, the coil bobbin 31 is passed through the coils 20a through 20d that are in engagement with the engagement hole 26 formed in the first circuit board 18 and the second circuit board 19. FIG. 15 shows the status where this required processing has been completed.

In the process for the mounting and soldering processing of the conductor 23 and the other electronic elements with respect to the first circuit board 18 and the second circuit board 19, the mother board 25 holds the first circuit board 18 and the second circuit board 19 by a strong holding force and so there is no danger that the first circuit board 18 and the second circuit board 19 will fall off of the mother board 25 while these processes are being performed. Accordingly, it is possible to facilitate this processing and it is also possible to manufacture the first circuit board 18 and the second circuit board 19 so that there is a high yield.

Figure 24A:
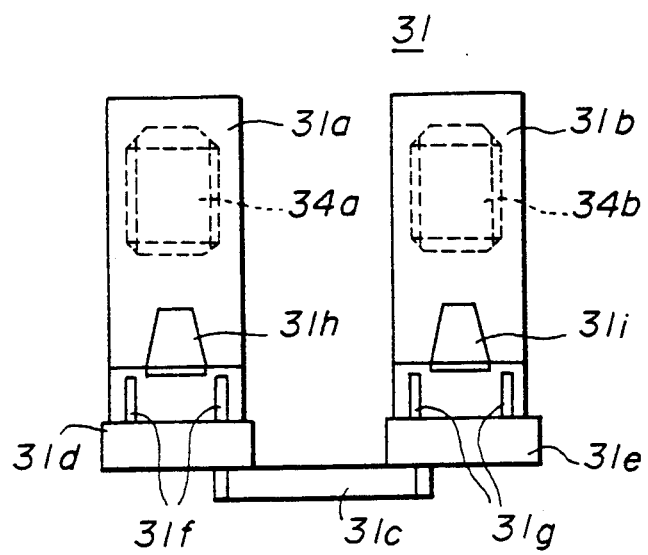
FIG. 24A and FIG. 24B are diagrams describing a coil bobbin.
Figure 24B:
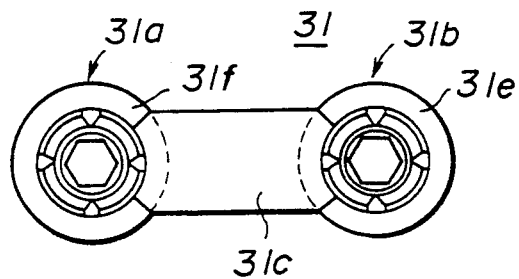
Figure 25:
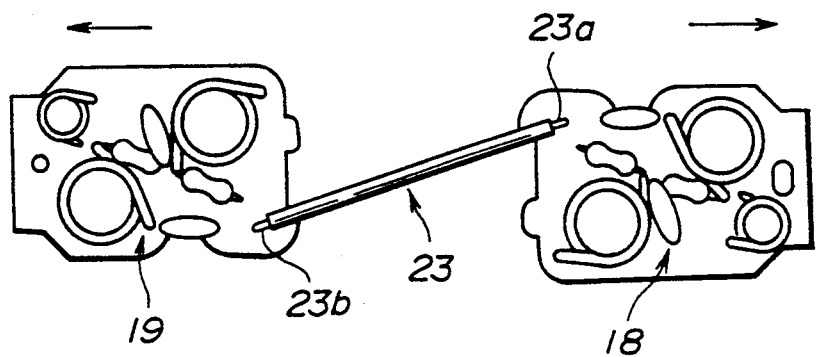
FIG. 25 is a diagram indicating the status where an external force is impressed in the direction so as to separate a circuit board.

Moreover, the coil bobbin 31 that is mounted to each of the first circuit board 18 and the second circuit board 19 in the processes described above has the configuration that is shown in FIG. 24A and FIG. 24B. This coil bobbin 31 is formed of resin and has a structure where a pair of center portions 31a,31b pass through a communicating portion 31c so that the two coils are mounted. In addition, the pair of center portions 31a,31b are formed with rim portions 31d,31e from their lower portions, ribs 31f,31g, and protruding portions 31h,31i.

The coil bobbin 31 having the configuration described above is brought into engagement with the engagement hole 26 formed in the first circuit board 18 and the second circuit board 19 and mounted to the first circuit board 18 and the second circuit board 19. In the state where it is mounted, each of the first circuit board 18 and the second circuit board 19 are held between the rim portions 31d,31e and the protruding portions 31h,31i. In addition, the coil bobbin 31 is definitely mounted to the first circuit board 18 and the second circuit board 19 by the ribs 31f,31g pressing the inner edge of the engagement hole 26. When the fitting processing for the conductor 23 and the other electronic elements has been completed as described above, the process for removing the first circuit board 18 and the second circuit board 19 from the mother board 25 is performed.

Figure 16:
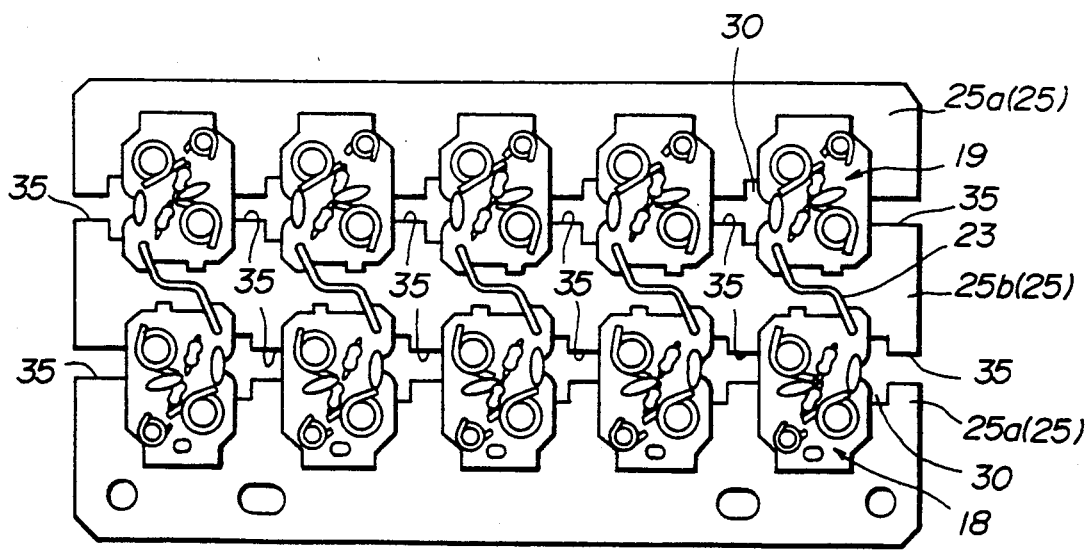

Removing the first circuit board 18 and the second circuit board 19 from the mother board 25 is performed by pressing processing to the mother board 25, and the stress release holes 30 that were previously formed are linked by removing holes 35 that cross the mother board 25. FIG. 16 shows a mother board 25 for which these removal holes 35 have been formed.

By the formation of the removal holes 35 as has been described above, the mother board 25 is divided into three portions (shown by 25a, 25b and 25c in the figure).

Accordingly, the work for the removal of the first circuit board 18 and the second circuit board 19 involves removing the first circuit board 18 and the second circuit board 19 from the divided mother boards 25a,25b, 25c and hence the work of removing the first circuit board 18 and the second circuit board 19 is facilitated. When they are removed, there is no excessive force applied to the first circuit board 18 and the second circuit board 19 and there is no load applied to either the electronic elements or to the soldered portions. Accordingly, there is no damage to the electronic elements nor flaking of the solder and it is possible to improve the reliability of the products as well as improve the yield.

The first circuit board 18 and the second circuit board 19 are manufactured on the basis of the method described above. Required assembly processes are then implemented for the manufactured circuit boards 18 and 19 to manufacture the electrical signal filter 10 shown in FIG. 5 and FIG. 6. The following is a description of the assembly work performed after the manufacture of the first circuit board 18 and the second circuit board 19.

The first circuit board 18 and the second circuit board 19 that have been manufactured as has been described above, are fixed in position by the mechanism to clamp and fix the conductor 23 by the first shield half member 15a and the second shield member 15b. This configuration of this stopping mechanism comprises stoppers 53a,53b formed on the first shield half member 15a as has been described earlier, and stopper holes 55a,5b formed on the second shield member 15b; (refer to FIG. 10, FIG. 11A, FIG. 11B). Then, these stoppers 53a,53b are brought into engagement with the stopper holes 55a,55b, so that the first shield half member 15a and the second shield member 15b are stopped in position.

Figure 17:
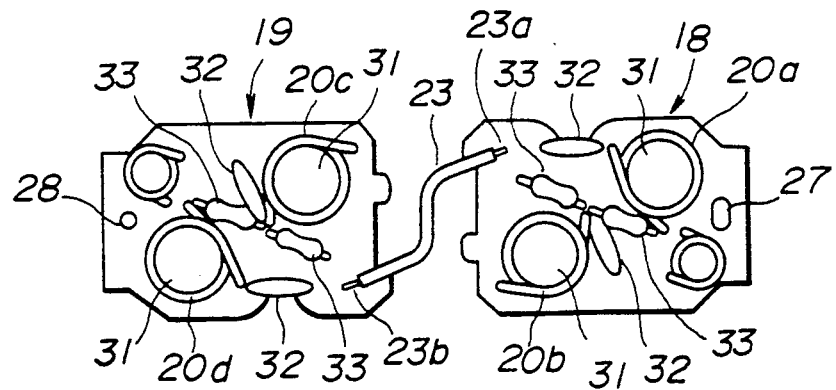

FIG. 17 shows the status where the first circuit board 18 and the second circuit board 19 are made into one unit by the conductor 23. Moreover, in this figure, the input side connector 40 and the output side contact pin 22 are omitted.

As has already been described, the conductor 23 is wired diagonally between the first circuit board 18 and the second circuit board 19 and accordingly, the length of the conductor 23 is long and so even when an external force is applied in the direction so as to separate the first circuit board 18 and the second circuit board 19, it is possible to prevent failure due to the breaking of the conductor, as occurred in a conventional apparatus. By this, it is possible to facilitate the assembly work since it not necessary to pay the amount of care to the conductor 23 that was required in the conventional apparatus, and it is also possible to improve the yield.

Figure 18A:
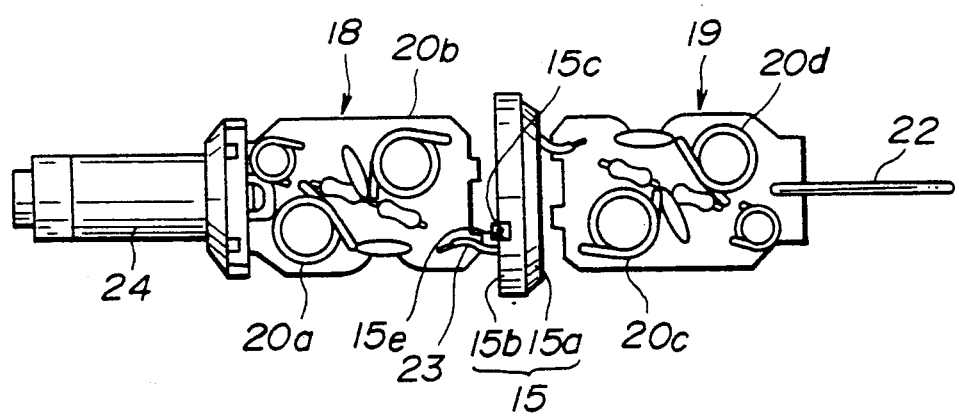
Figure 18B:
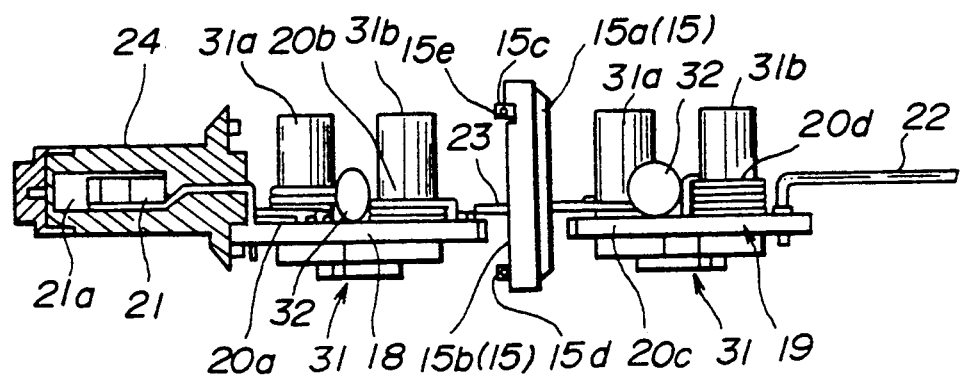

In the state where the conductor 23 is disposed inside the shield portion 15, the conductor 23 passes through the cavity portion formed inside the shield portion 15 as shown in FIG. 5, and there is no excess of the conductor 23. In this manner, by selecting the position for the connection of the conductor 23 to the first circuit board 18 and the second circuit board 19, to the position described above, it is possible to compactly house the connector inside the shield portion 15 and at the same time have a conductor 23 having a comparatively long length. FIG. 18A and FIG. 18B show shield portion 15 in which a conductor 23 is stopped in position in the manner described above.

When the conductor 23 is arranged in the shield portion 15, the next step is bringing the first shield half member 15a and the second shield member 15b into engagement with the first circuit board 18 and the second circuit board 19 on which are arranged the stress release holes 30 and the output side contact pin 22. and then soldering these portions manually to the first circuit board 18 and the second circuit board 19.

The positions for the formation of the pairs of stopper holes 55a,55b and the stoppers 53a,53b is selected to a diagonal position with respect to the first circuit board 18 and the second circuit board 19 and in particular, the pairs of stopper holes 55a,55b and the stoppers 53a,53b are at a position in the vicinity of the position for the soldering of the shield portion 15 and the first circuit board 18 and the second circuit board 19. Accordingly, it is possible to solder the stopper 53b and the stopper hole 55a at the same time.

Figure 19A:
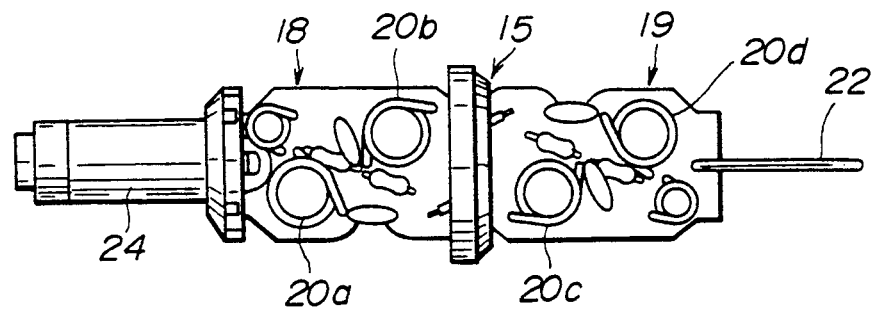
Figure 19B:
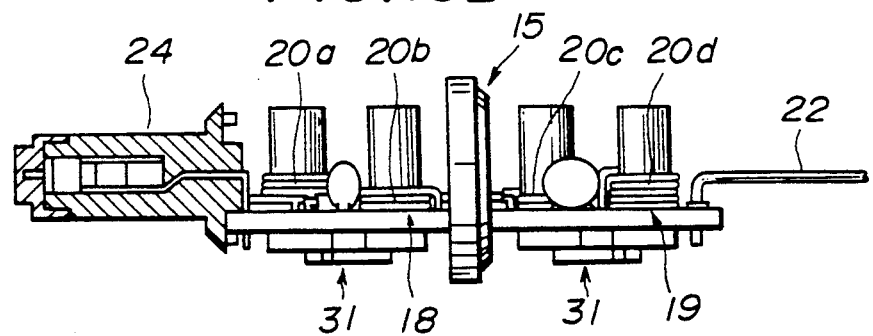

By this, and as indicated in FIG. 19A and FIG. 19B, the first circuit board 18 and the second circuit board 19 are made into one unit, and the first circuit board 18 and the second circuit board 19 can be handled as a single unit in the later assembly processes that are to be implemented, thus facilitating the assembly work.

Figure 20:
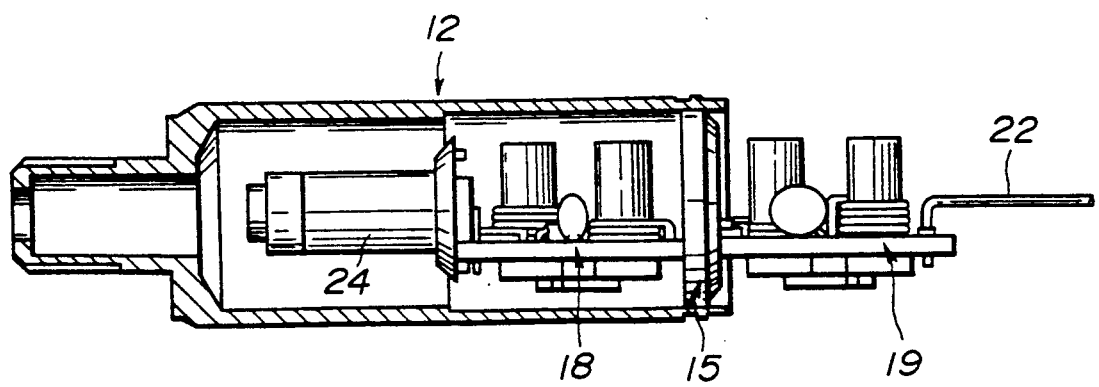
Figures 21A, 21B:
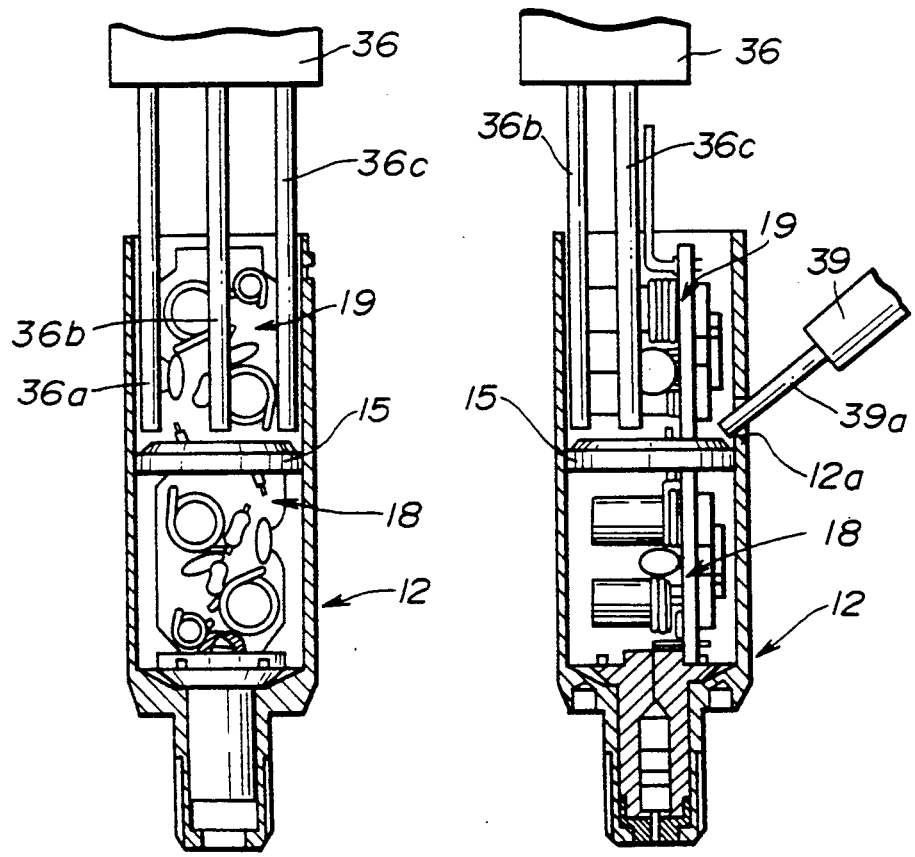
Figure 21C:
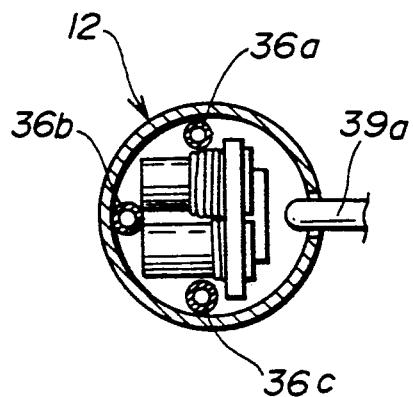

In the manner as has been described above, the united first circuit board 18 and the second circuit board 19 and the shield portion 15 are inserted into the inner case 12 as shown in FIG. 20. When this is done, then the first circuit board 18 and the second circuit board 19 which are a single unit as has been described above, are placed as one unit by the shield portion 15 and so this insertion process is facilitated.

When the first circuit board 18 and the second circuit board 19 are inserted to inside the inner case 12, soldering is performed for the shield portion 15 and the inner case 12. This soldering is performed by the following procedure.

First, after the first circuit board 18 and the second circuit board 19 have been inserted from the opening portion of the inner case 12, the inner case 12 is stood up so that the opening portion is upwards. After this, in this status, the dispenser having the discharge openings 36a,36b,36c from the opening portion of the inner case 12 is inserted from the second circuit board 19 of the shield portion 15, to the outer peripheral portion (the boundary portion with the inner side surface of the inner case 12) that is the upper surface portion. Furthermore, the dispenser 39 having the discharge opening 39a is inserted from the dispenser insertion opening 12n provided on the inner case 12, to the back surface of the second circuit board 19 and cream solder 37 is applied to the back surface of the second circuit board 19.

Then, external peripheral position in the vicinity of the position of the shield portion 15 of the inner case 12 is heated by a high-frequency inductance heater and the cream solder 37 is melted so that soldering is performed for the shield portion 15 and the inner side surface of the inner case 12.

After the soldering has been performed, a taper portion 52 is formed on the outer periphery of the first shield half member 15a. Accordingly, the melted solder follows along the sloping surface of the taper portion 52 and deeply fills the gap formed between the taper portion 52 and the inner case 12. Accordingly, when this soldering is performed, it is possible to prevent the molten solder from running into the central portion of the shield portion 15 and for there to be a large contact formed by the taper portion 52 for the solder.

When this soldering is performed, soldering is also performed for the stoppers 15c,15d and the stopper holes 15e,15f that configure the stopper mechanism, and the first shield half member 15a and the second shield member 15b are fully fixed.

Figure 22:
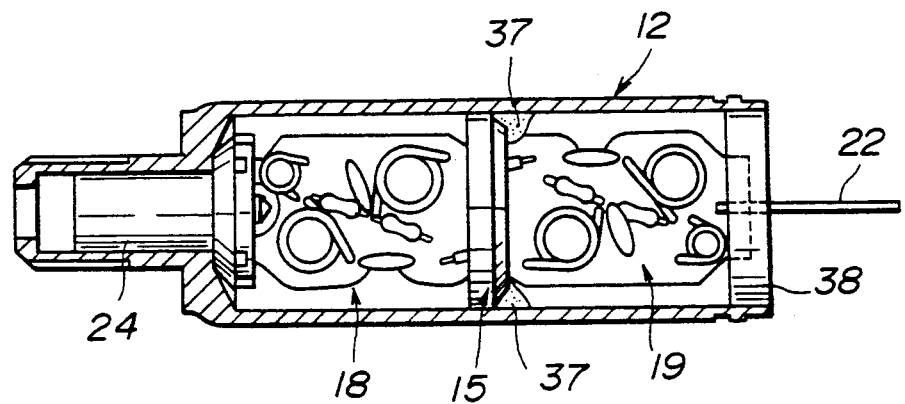

When the soldering of the shield portion 15 has been completed as described above, then the flux that has come from the cream solder is washed and then, as shown in FIG. 22, a contact pin 22 is inserted into the opening portion of the inner case 12 and the cap 38 is fitted. Following this, inductance adjustment of each of the coils 20a through 20d is performed using the adjustment holes 12e through 121 formed at a position opposing each of the coils 20a through 20d of the inner case 12 and in the same manner, the inner case 12 is filled with foaming agent from the holes 12i,12j formed in the inner case 12 in the same manner.

Figure 23:
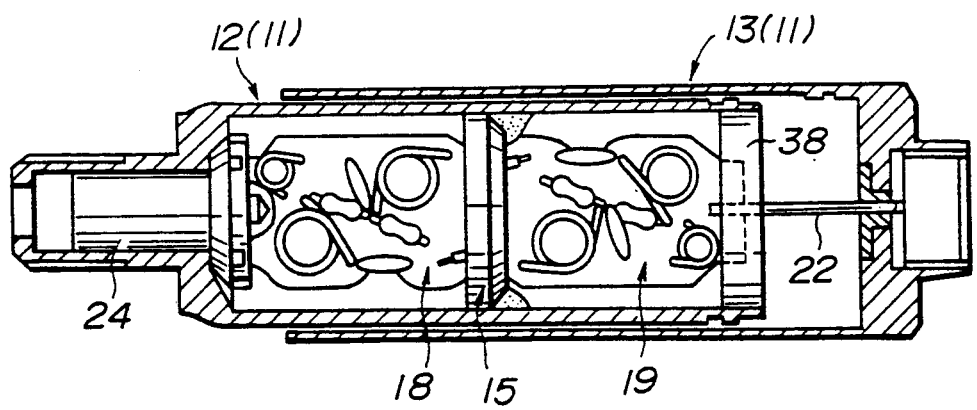

When the first circuit board 18 and the second circuit board 19 and the shield portion 15 have been assembled to the inner case 12 in the manner described above, the outer side case 13 is then inserted as indicated in FIG. 23. Following this, the portion in the vicinity of the opening portion of the outer side case 13 is closed, so that the inner case 12 and the outer case 13 are integrated and the shield case 11 is formed. At the closed portion in the vicinity of the opening of the outer case 13, the electromagnetic shielding is made, and the inner case 12 and the outer case 13 are mechanically joined together.

In the shield case 11 according to the present embodiment, the inner case 12 is is inserted into the outer case 13. Thus, only one shielding position is provided. With this arrangement, it becomes possible to reduce the number of portions having weak shielding property and strength, as composed with the prior art and to improve the shielding property and mechanical strength.

It is possible to employ an alternative in order to integrally form the inner case 12 and the outer case 13. In the alternative, the edge of the outer case 13 is rolled over the inner case 12 at the point of sealing, thus providing a good mechanical seal and improved RF shielding. The rolled edge also provides better security against theft of a signal in a CATV system. The unit cannot be entered and returned to a different frequency.

As has been described previously, the rollette processed portion 12c of the inner case 12 is provided. When integrating the inner case 12 and the outer case 13, the rollette processed portion 12c engages with an inner portion of the outer case 13. Thus, it is possible to ensure shielding at the engagement portion of the rollette processed portion 12c and the inner portion of the outer case 13 to improve the strength of joining the inner case 12 and the outer case 13.

As has been described previously, the ultraviolet light hardening adhesive is coated on the shielding position of the shield case 11. Then, ultraviolet light is irradiated onto the adhesive, so that it is hardened. The ultraviolet light hardening adhesive is provided for the purpose of preventing rain, dust or the line from entering the shield case 11. The hardened ultraviolet light adhesive has good durability and age deterioration, as compared with the conventional O-ring.

The coating of ultraviolet light hardening adhesive is performed after the inner case 12 and the outer case 13 are integrated. Thus, it is possible to visually determine whether or not the ultraviolet light hardening adhesive is uniformly coated. It is also possible to use O-rings in place of ultraviolet light hardening adhesive. By the above-mentioned production steps, the electrical signal filter 10 shown in FIGS. 5 and 6 is formed.

The following is a description of a second embodiment according to the present invention.

Figure 26:
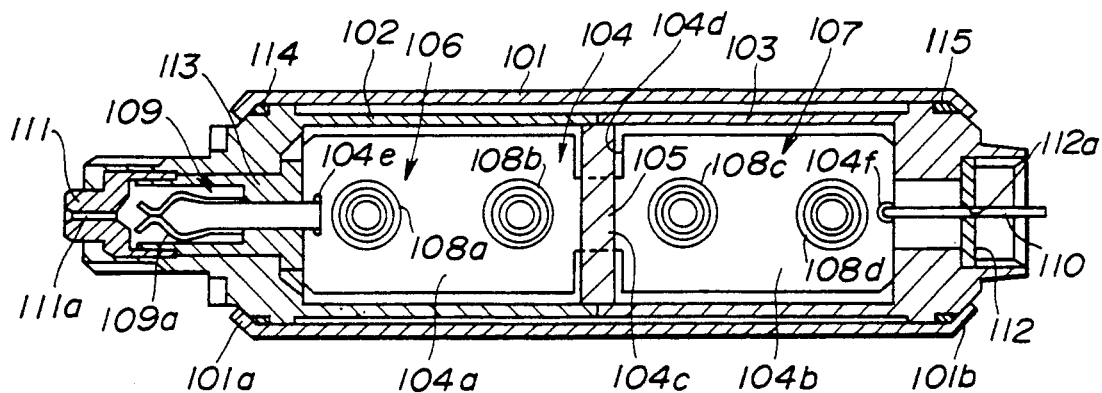
FIG. 26 and FIG. 27 are sectional views of an electrical signal filter of a second embodiment according to the present invention.
Figure 27:
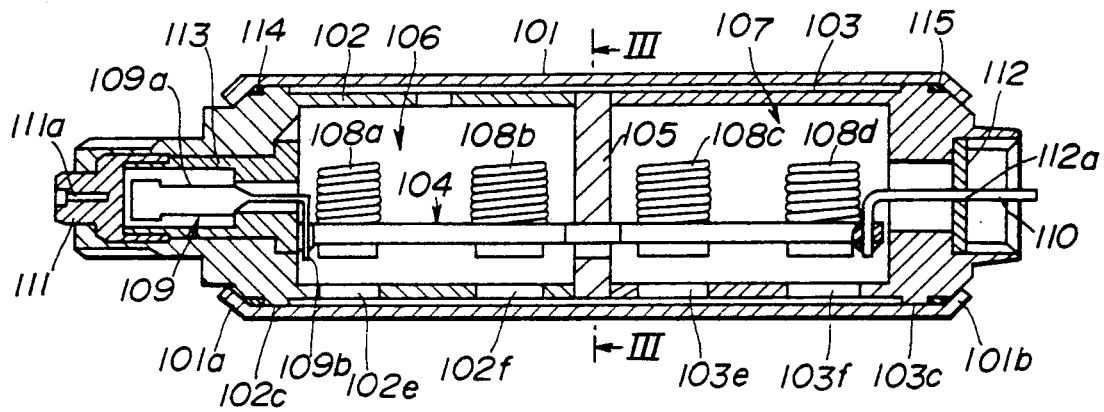
Figure 28:
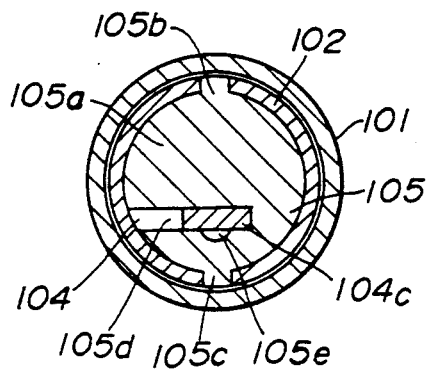
FIG. 28 is a sectional view taken along section lines III—III of FIG. 27.

FIG. 26 through FIG. 28 show an electrical signal filter according to a second embodiment according to the present invention. In each of the figures, the electrical signal filter has an input side case 102 and an output side case 103 inserted into a substantially cylinder-shaped shield case 101, with the filter circuit board 104 and the shield member 105 being housed inside the cases 102,103.

The filter circuit board 104 is formed monolithically from a input side half circuit board 104a provided with a first filter circuit 106, an output side half circuit board 104b provided with a second filter circuit 107, a connector portion 104c that connects between the input side half circuit board 104a and the output side half circuit board 104b, and a concave portion 104d that mounts a shield portion 105 that is provided adjacent to the connector portion 104c. In addition, the first filter circuit 106 and the second filter circuit 107 are LC circuits comprising condensors (not indicated in the figure) and coils 108a through indicated in the figure). Accordingly, the assembly is easier when compared to the configuration of the first embodiment where separated circuit boards are connected by wire.

Numeral 109 is an input side contact and comprises a contact portion 109a and a base end portion 109b that is soldered to the circuit board numeral 104. 110 is an output side contact pin with one end passing through the output side hole 104f of the circuit board 104 and being soldered, and the other end bent into an L-shape and extending towards the output side.

As shown in FIG. 28, the shield portion 105 comprises the protrusions 105b 105c that protrude up and down from the outer periphery of the main unit 105a, and the engagement portion 105d that engages with the circuit board 104c of the circuit board 104, and a concave portion 105e so that the there is no contact with the pattern shield portion 105 of the circuit board 104.

As shown in FIG. 29A through FIG. 29C, the input side case 102 is provided with a male threaded portion 102b for connection to one end of the cylindrical main unit 102a, and to the outer periphery of the main unit 102a is provided a rollette processed portion 102c. Inside the main body 102a and the male threaded portion 102b is provided a cavity portion 102d that houses the circuit board 104 and the contact 109, and to the outer periphery of the main body 102 are holes 102e,102f in order to adjust the inductance of the coils 108a,108b on the circuit board 104, and that pierce into the cavity 102d. In addition, the main body 102a is provided at an end with cutouts 102g,102h that are entered by the protruding portions 105b,105c of the shield member 105 previously described.

The output side case 103 is provided with a female threaded portion at one end of the main body 103a of the same diameter as the main body 102a of the input side case 102 previously described, and to the outer periphery of the main body 103 is provided a rollette processing portion 103c. The inner portion of the main body 103a is provided with a cavity portion 103d that communicates with the female screw portion 103b, and the outer periphery of the main body 103a is provided with holes 103e,103f for adjusting the inductance of the coils 108c,108d on the circuit board 104, and that pass through inside the cavity portion 103d. Also, the main body 102a is provided at an end with cutouts 103g,103h that are entered by the protruding portions 105b,105c of the shield member 105 previously described.

The following is a description of the procedure for the assembly of the electrical signal filter according to this second embodiment.

First, the circuit board 104 is prepared with the first filter circuit 106, second filter circuit 107, the input side contact 109 and the output side contact pin 110 soldered. The input side case 102 is mounted with the rubber seal member 111 having a small hole 111a through which a wire passes to inside the cavity portion 102d. Also, the output side case 103 has a flat plate shaped, rubber seal member 112 (having a small hole 112a for passing a wire through) mounted to the groove 103i of the female screw portion 103b which is inside the cavity 103d.

Then, the cylindrical guide member 113 is assembled to the input side contact 109 of the circuit board 104. This guide member 113 is formed from an insulating body, and protects the contact 109 from deformation when it is being assembled to the input side case 102. Then, the engagement portion 105d of the circuit board 104c from the mounting concave portion 104d of the circuit board 104, and the shield portion 105 is mounted as a unit to the central portion of the circuit board 104. Then, the circuit board 104 is inserted into the cavity portion 102d of the input side case 102, with the guide member 113 inserted first. When this is done, the circuit board 104 has a minimal configuration since the case and the connectors are formed monolithically and so the assembly processes are facilitated and the efficiency of assembly is good.

The guide member 113 engages with the small diameter portion provided inside the cavity portion 102d 105b,105c pressed into the cutouts 102g,102h. By this it is possible for the guide member 113 to be assembled inside the shield portion 111 without any damage to the input side contact 109, and the shield portion 105 enables the input side half circuit board 104a of the circuit board 104 to be positioned at a mounting position opposing the input side case 102 circuit board 104.

Following this, the output side half circuit board 104b of the circuit board 104 is inserted into the cavity portion 103d of the output side case 103. When this is done, the output side contact pin 110 is passed through the small hole 112a of the shield member 112, and the protruding portions 105b,105c of the shield portion 105 are pressed into the cutout portions 103g,103h of the shield portion 105. In this manner, the pressing of the protruding portions 105b,105c of the shield portion 105 into the cutout portions 103g,103h assembles the input side case 102 and the output side case 103 into a single unit and also positions the circuit board 104, so that the adjustment portion (not indicated in the figure) provided on the bottom of the coils 108a through 108d opposes each of the holes 102e,102f,103e,103f.

Then, a screwdriver (not indicated in the figure) is inserted from each of the holes 102e,102f,103e,103f and the adjustment portions of each of the coils 108a through 108d turned to adjust the inductance of each of the coils 108a through 108d. Then, ring-shaped packing 114,115 is inserted around the external periphery adjacent to the rollette processed portions 102c,102d of the connector main body 102a,103a After this, the cases 102,103 that form one unit via the shield portion 105 as has been described above, are inserted into the shield case 101 along with the circuit board 104. When this is done, tightening processing is not implemented for both ends 101a,101b of the shield case 101, and the insertion of the cases 102,103 is facilitated. Also, the rollette processed portions 102c,102d that protrude slightly from the outer periphery of the case 102,103 are in contact with the inner wall of the shield case 101 and so the case 102,103 is held inside the shield case 101 without there being any movement, and the shield case 101 is earthed.

Following this, both of the end portions 101a,101b of the shield case 101 have tightening processing implemented so that the end portions slope downwards towards the inside, and the packing 114,115 fitted to the outer periphery of the case 102,103 is compressed in both ends 101a,101b, and the space between the shield case 101 and the cases 102,103 is sealed. Accordingly, there is an tight seal made by the packing 114,115 and the seal member 111 for the inside of the case 102,103 and watertightness with respect to rain when there is outdoor use is ensured. In addition, there is shielding by the cases 102,103 and the shield case 101.

What is claimed is:

1. An electric signal filter comprising:
   circuit board means;
   first and second filter circuits mounted on said circuit board means;
   a unitary, cup-like substantially cylindrical inner case open at one end portion, said circuit board means being inserted entirely within said inner case via said open end portion, said inner case having a first connector at the other end portion thereof connected to one of said filter circuits;
   a cup-like substantially cylindrical outer case open at one end portion, said inner case being inserted into said outer case via said open end portion to assemble said inner and outer cases, said inner case entering said outer case with the open end portion entering first, and said outer case having a second connector at the other end portion theeof connected to the other of said filter circuits, said outer case being engageable with said inner case such that said inner case can be positioned in said outer case so that said inner and outer cases substantially surround said filter circuits and said circuit board means and filter circuits can be shielded in said inner and outer cases, said filter circuits shielded in said inner and outer cases being connectable to an external circuit via said first and second connectors; and
   a shield member provided between said first and second filter circuits, said shield member being formed of a pair of axially opposed, disc-like shield member halves having means for retaining said pair of opposed shield member halves in an assembled state, said shield member halves forming an internal cavity in said shield member through which a conductor electrically connecting said first and second filter circuits passes.

2. The electrical signal filter of claim 1 wherien said assembled inner and outer cases are joined into a unitary structure.

3. The electrical signal filter of claim 2 wherien said outer case is deformed adjacent its said one end portion to join said inner and outer cases intoa unitary structure.

4. The electrical signal filter of claim 2 wherein said outer case is deformed adjacent its said other end portion to join said inner and outer cases into a unitary structure.

5. The electrical signal filter of claim 1 wherein the exterior of said assembled inner and outer cases is coated with an ultraviolet light hardenign adhesive.

6. The electrical signal filter of claim 1 wherein said first connector has a holder portion for engaging and supporting said circuit board, and wherein said first connector has a connector means that is soldered to said circuit board.

7. The electrical signal filter of claim 6, wherein:
said holder portion comprises a holder step portion and a holder protruding portion formed on said holder portion, so that said circuit board is held between and supported by said holder protruding portion and said holder step portion.

8. The electrical signal filter of claim 7 wherein:
said holder step and protruding portions of said holder portion are provided at two places, and disposed at positions symmetrical with respect to a postiion of said connector means.

9. The electrical signal filter of claim 1, wherein: said pair of half shield members have formed therein holes and cutouts to mount said pair of half shield members to a circuit board containing said first and second filter circuits.

10. The electrical signal filter of claim 1 including a stopper mechanism formed by protrusions on one of said half shield members which are insertable in holes formed in another of said half shield members.

11. The electrical signal filter of claim 1 wherein: said stopper mechanism is provided on the periphery of said one of half shield members.

12. The electrical signal filter of claim 20 wherein said half shield members are soldered together.

13. The electrical signal filter of claim 1 wherien said half shield members are soldered to said case.

14. The electrical signal filter of claim 1, wherein said circuit board means comprises a first circuit board containing said first filter circuit and a second circuit board containing said second filter circuit, and wherein said conductor extends from a predetermined position on said first circuit board in a generally radial direction with respect to said cylindrical inner and outer cases to a predetermined position on said second circuit board.

* * * * *

UNITED STATES PATENT AND TRADEMARK OFFICE
CERTIFICATE OF CORRECTION

PATENT NO. : 5,150,087
DATED : September 22, 1992
INVENTOR(S) : Yoshie, et al

It is certified that error appears in the above-identified patent and that said Letters Patent is hereby corrected as shown below:

CLAIM 1, Col. 18, Line 39, delete "theeof" and substitute therefor ---thereof---; CLAIM 2, Col. 18, Line 59, delete "wherien" and substitute therefor ---wherein---; CLAIM 3, Col. 18, Line 62, delete "wherien" and substitute therefor ---wherein---; CLAIM 3, Col. 18, Line 64, delete "intoa" and substitute therefor ---into a---; CLAIM 5, Col. 3, Line 3, delete "hardenign" and substitute therefor ---hardening---; CLAIM 12, Col. 20, Line 10, delete "20" and substitute therefor ---1---; CLAIM 13, Col. 20, Line 12, delete "wherien" and substitute therefor ---wherein---

Signed and Sealed this

Ninth Day of November, 1993

Attest:

BRUCE LEHMAN

Attesting Officer

Commissioner of Patents and Trademarks